(12) United States Patent
Bothe et al.

(10) Patent No.: US 11,502,178 B2
(45) Date of Patent: Nov. 15, 2022

(54) FIELD EFFECT TRANSISTOR WITH AT LEAST PARTIALLY RECESSED FIELD PLATE

(71) Applicant: Wolfspeed, Inc., Durham, NC (US)

(72) Inventors: Kyle Bothe, Cary, NC (US); Jia Guo, Apex, NC (US); Terry Alcorn, Cary, NC (US); Fabian Radulescu, Chapel Hill, NC (US); Scott Sheppard, Chapel Hill, NC (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 17/081,476

(22) Filed: Oct. 27, 2020

(65) Prior Publication Data

US 2022/0130966 A1    Apr. 28, 2022

(51) Int. Cl.
*H01L 29/40* (2006.01)
*H01L 29/417* (2006.01)
*H01L 29/66* (2006.01)
*H01L 29/778* (2006.01)

(52) U.S. Cl.
CPC .......... *H01L 29/407* (2013.01); *H01L 29/402* (2013.01); *H01L 29/408* (2013.01); *H01L 29/41766* (2013.01); *H01L 29/66431* (2013.01); *H01L 29/66462* (2013.01); *H01L 29/778* (2013.01); *H01L 29/7783* (2013.01)

(58) Field of Classification Search
CPC ......... H01L 29/66431; H01L 29/66462; H01L 29/778; H01L 29/7783; H01L 29/402; H01L 29/407
See application file for complete search history.

(56) References Cited

U.S. PATENT DOCUMENTS

| | | | |
|---|---|---|---|
| 6,849,882 B2 | 2/2005 | Chavarkar et al. |
| 7,126,426 B2 | 10/2006 | Mishra et al. |
| 7,230,284 B2 | 6/2007 | Parikh et al. |
| 7,419,892 B2 | 9/2008 | Sheppard et al. |
| 7,501,669 B2 | 3/2009 | Parikh et al. |
| 7,550,783 B2 | 6/2009 | Wu et al. |
| 7,573,078 B2 | 8/2009 | Wu et al. |
| 7,875,537 B2 | 1/2011 | Suvorov et al. |
| 8,823,057 B2 | 9/2014 | Sheppard et al. |

(Continued)

FOREIGN PATENT DOCUMENTS

| | | |
|---|---|---|
| CN | 108565283 A | 9/2018 |
| KR | 20080108486 A | 12/2008 |

OTHER PUBLICATIONS

International Search Report and Written Opinion of the International Searching Authority, PCT/US2022/030233, dated Sep. 2, 2022, 10 pages.

*Primary Examiner* — Joseph C. Nicely
(74) *Attorney, Agent, or Firm* — Sage Patent Group

(57) ABSTRACT

A transistor device includes a semiconductor layer, a surface dielectric layer on the semiconductor layer, and at least a portion of a gate on the surface dielectric layer. The surface dielectric layer includes an aperture therein that is laterally spaced apart from the gate. The transistor device includes an interlayer dielectric layer on the surface dielectric layer, and a field plate on the interlayer dielectric layer. The field plate is laterally spaced apart from the gate, and at least a portion of the field plate includes a recessed portion above the aperture in the surface dielectric layer.

45 Claims, 11 Drawing Sheets

(56) References Cited

U.S. PATENT DOCUMENTS

| | | |
|---|---|---|
| 9,318,594 B2 | 4/2016 | Sheppard et al. |
| 9,711,633 B2 | 7/2017 | Sheppard et al. |
| 9,847,411 B2 | 12/2017 | Sriram et al. |
| 9,984,881 B2 | 5/2018 | Sheppard et al. |
| 10,692,998 B2 | 6/2020 | Fayed et al. |
| 10,892,356 B2 | 1/2021 | Sriram et al. |
| 10,971,612 B2 | 4/2021 | Bothe et al. |
| 2005/0253167 A1 | 11/2005 | Wu et al. |
| 2006/0202272 A1 | 9/2006 | Wu et al. |
| 2008/0073670 A1 | 3/2008 | Yang et al. |
| 2008/0128752 A1 | 6/2008 | Wu |
| 2009/0230429 A1 | 9/2009 | Miyamoto et al. |
| 2010/0276698 A1 | 11/2010 | Moore et al. |
| 2012/0049973 A1 | 3/2012 | Smith, Jr. et al. |
| 2012/0194276 A1 | 8/2012 | Fisher |
| 2013/0134482 A1 | 5/2013 | Yu et al. |
| 2013/0193485 A1* | 8/2013 | Akiyama ............. H01L 29/778 257/194 |
| 2013/0228789 A1* | 9/2013 | Yamamura ........... H01L 29/402 257/195 |
| 2014/0001478 A1 | 1/2014 | Saunier et al. |
| 2014/0361342 A1* | 12/2014 | Sriram ................. H01L 29/407 257/194 |
| 2020/0027956 A1* | 1/2020 | Aoki ................ H01L 21/31144 |
| 2021/0013314 A1 | 1/2021 | Hu et al. |
| 2022/0302271 A1 | 9/2022 | Trang et al. |

\* cited by examiner

FIELD EFFECT TRANSISTOR WITH AT LEAST PARTIALLY RECESSED FIELD PLATE

BACKGROUND

The present disclosure relates to transistor structures and in particular to field effect transistors including field plates.

Narrow bandgap semiconductor materials, such as silicon (Si) and gallium arsenide (GaAs), are widely used in semiconductor devices for low power and, in the case of Si, low frequency applications. However, these semiconductor materials may not be well-suited for high power and/or high frequency applications, for example, due to their relatively small bandgaps (1.12 eV for Si and 1.42 for GaAs at room temperature) and relatively small breakdown voltages.

Interest in high power, high temperature and/or high frequency applications and devices has focused on wide bandgap semiconductor materials such as silicon carbide (3.2 eV for 4H—SiC at room temperature) and the Group III nitrides (e.g., 3.36 eV for GaN at room temperature). These materials may have higher electric field breakdown strengths and higher electron saturation velocities than GaAs and Si.

A device of particular interest for high power and/or high frequency applications is the High Electron Mobility Transistor (HEMT), which is also known as a modulation doped field effect transistor (MODFET). In a HEMT device, a two-dimensional electron gas (2DEG) may be formed at the heterojunction of two semiconductor materials with different bandgap energies, where the smaller bandgap material has a higher electron affinity than the wider bandgap material. The 2DEG is an accumulation layer in the undoped smaller bandgap material and can contain a relatively high sheet electron concentration, for example, in excess of $10^{13}$ carriers/cm$^2$. Additionally, electrons that originate in the wider bandgap semiconductor may transfer to the 2DEG, allowing a relatively high electron mobility due to reduced ionized impurity scattering. This combination of relatively high carrier concentration and carrier mobility can give the HEMT a relatively large transconductance and may provide a performance advantage over metal-semiconductor field effect transistors (MESFETS) for high-frequency applications.

HEMTs fabricated in the gallium nitride/aluminum gallium nitride (GaN/AlGaN) material system can generate large amounts of RF power due to a combination of material characteristics, such as relatively high breakdown fields, relatively wide bandgaps, relatively large conduction band offset, and/or relatively high saturated electron drift velocity. A major portion of the electrons in the 2DEG may be attributed to polarization in the AlGaN.

Field plates have been used to enhance the performance of GaN-based HEMTs at microwave frequencies and have exhibited performance improvement over devices without field plates. Many field plate approaches have involved a field plate connected to the source of the transistor with the field plate on top of the drain side of a channel. This can result in a reduction of the electric field on the gate-to-drain side of the transistor, thereby increasing breakdown voltage and reducing the high-field trapping effect. However, some transistors with gate-to-drain field plates can exhibit relatively poor reliability performance, particularly at class C (or higher class) operation where the electric field on the source side of the gate becomes significant.

FIG. 1 shows a GaN-based HEMT 10 formed on a silicon carbide substrate 12. A GaN channel layer 16 is on the substrate 12, and an AlGaN barrier layer 18 is on the channel layer 16. A two-dimensional electron gas (2DEG) 20 arises in the channel layer 16 adjacent the barrier layer 18. A source contact 22 and a drain contact 24 are formed on the channel layer 16. The conductivity of the 2DEG 20 is modulated by applying a voltage to a gate 26 that is formed on the barrier layer 18 between the source contact 22 and the drain contact 24. As shown in FIG. 1, the gate 26 may have a mushroom or T-top configuration in which the gate 26 contacts the barrier layer 18 in a relative narrow contact region that extends through a surface dielectric layer 25.

The HEMT 10 includes a field plate 28 that is connected to the source contact 22. The field plate 28 is spaced apart from the gate 26 by an interlayer dielectric layer 21, and is spaced apart from the barrier layer 18 by the interlayer dielectric layer 21 and the surface dielectric layer 25. The field plate 28 extends above the gate 26 and laterally toward the drain 24.

The field plate 28 is connected to the source contact 22. Connecting the field plate 28 to the source contact 22 provides a reduction in gate-to-drain capacitance (Cgd), which consequently can enhance the gain of the device. In addition to reducing gate-to-drain capacitance Cgd, the presence of the field plate 28 may improve linearity of the device and/or reduce the drain bias dependence of the capacitance. While GaN-based HEMTs generally display good linearity, further improvement may be desired for in high power RF applications. Moreover, while the structure shown in FIG. 1 can have a reduced gate-to-drain capacitance Cgd compared to structures without a field plate, the gate-to-drain capacitance Cgd can still show a large dependence on the bias of the drain contact 24.

SUMMARY

A transistor device according to some embodiments includes a semiconductor layer, a surface dielectric layer on the semiconductor layer, and at least a portion of a gate on the surface dielectric layer. The surface dielectric layer includes an aperture therein that is laterally spaced apart from the gate. The transistor device includes an interlayer dielectric layer on the surface dielectric layer, and a field plate on the interlayer dielectric layer. The field plate is laterally spaced apart from the gate, and at least a portion of the field plate is in the aperture in the surface dielectric layer.

In some embodiments, the field plate includes a non-recessed portion extending over the semiconductor layer. The recessed portion of the field plate is vertically spaced from the semiconductor layer by a smaller distance than the non-recessed portion is vertically spaced from the semiconductor layer.

the interlayer dielectric layer extends into the aperture in the surface dielectric layer. In some embodiments, the aperture in the surface dielectric layer extends completely through the surface dielectric layer to expose the semiconductor layer. In some embodiments, the gate extends through the surface dielectric layer to contact the semiconductor layer.

The transistor device may further include source and drain contacts on the semiconductor layer, wherein the gate is between the source and drain contacts. The non-recessed portion may include a drain-side wing extending over the semiconductor layer toward the drain contact. In some embodiments, the field plate includes a source-side wing extending over the semiconductor layer toward the source contact. The drain-side wing may have a width of about zero to about 500 nm. In some embodiments, the drain-side wing is vertically spaced apart from the semiconductor layer by a combined thickness of the interlayer dielectric layer and the surface dielectric layer.

In some embodiments, the field plate is electrically connected to the source contact outside an active region of the transistor device. An electrical connection between the field plate and the source contact may not cross over the gate.

The transistor device may further include a second aperture in the surface dielectric layer that is laterally spaced apart from the first aperture. A recessed contact portion of the gate may extend through the second aperture. The second aperture may have beveled or rounded edges.

In some embodiments, the recessed portion of the field plate is vertically spaced apart from the semiconductor layer by a thickness of the interlayer dielectric layer. The recessed portion of the field plate may be vertically spaced apart from the semiconductor layer by a distance of about 60 nm to about 300 nm, in some embodiments by a distance of about 100 nm to about 200 nm, and in some embodiments by a distance of about 150 nm.

In some embodiments, the field plate is laterally spaced apart from the gate by a thickness of the interlayer dielectric layer. In some embodiments, the field plate is laterally spaced apart from the gate by a thickness of about 200 nm to about 700 nm, and in some embodiments by a thickness of about 200 nm to about 400 nm.

The field plate may have an overall width of about 600 nm to 1500 nm, and the recessed portion of the field plate may have a width of about 500 nm to about 900 nm. The aperture may have beveled or rounded edges.

A method of forming a transistor device according to some embodiments includes forming a surface dielectric layer on a semiconductor layer, forming an aperture in the surface dielectric layer, and forming a gate on the surface dielectric layer. The gate may be laterally spaced apart from the aperture. The method further includes forming an interlayer dielectric layer on the gate and the surface dielectric layer, the surface dielectric layer extending into the aperture, and forming a field plate on the interlayer dielectric layer above the aperture.

The method may further include forming a second aperture in the surface dielectric layer, wherein the first and second apertures are spaced apart laterally from each other. The gate may be formed over the second aperture, and the gate may include a recessed contact portion extending through the second aperture. The recessed contact portion of the gate may contact the semiconductor layer. The second aperture may have beveled or rounded edges.

Forming the first and second apertures may include forming a preliminary surface dielectric layer on the semiconductor layer, selectively etching the preliminary surface dielectric layer to form first and second openings in the preliminary surface dielectric layer, depositing a sacrificial dielectric layer on the semiconductor layer and the preliminary surface dielectric layer, the sacrificial dielectric layer filling the first and second openings, and anisotropically etching the sacrificial dielectric layer to expose portions of the semiconductor layer in the first and second openings and leaving side portions of the sacrificial dielectric layer on inner sidewalls of the first and second openings, wherein the preliminary surface dielectric layer and the side portions define the surface dielectric layer.

The method may further include forming source and drain contacts on the semiconductor layer, wherein the gate is between the source and drain contacts, and the field plate may include a recessed portion above the aperture and a drain-side wing extending over the semiconductor layer toward the drain contact.

The field plate may include a source-side wing extending over the semiconductor layer toward the source contact.

The drain-side wing may be vertically spaced apart from the semiconductor layer by a combined thickness of the interlayer dielectric layer and the surface dielectric layer. The drain-side wing may have a width of about zero to about 500 nm. The recessed portion of the field plate may have a width of about 500 nm to about 900 nm.

The method may further include electrically connecting the field plate to the source contact outside an active region of the transistor device, such that an electrical connection between the field plate and the source contact does not cross over the gate.

A transistor device according to some embodiments includes a semiconductor layer, a surface dielectric layer on the semiconductor layer, and at least a portion of a gate on the surface dielectric layer. The surface dielectric layer includes an aperture therein that is laterally spaced apart from the gate. The transistor device further includes an interlayer dielectric layer on the surface dielectric layer comprising a an indentation above the aperture, and at least a portion of a field plate in the indentation.

The field plate may include a non-recessed portion extending over the semiconductor layer, wherein the portion of the field plate in the indentation is vertically spaced from the semiconductor layer by a smaller distance than the non-recessed portion is vertically spaced from the semiconductor layer.

DETAILED DESCRIPTION OF EMBODIMENTS

Figure 1:
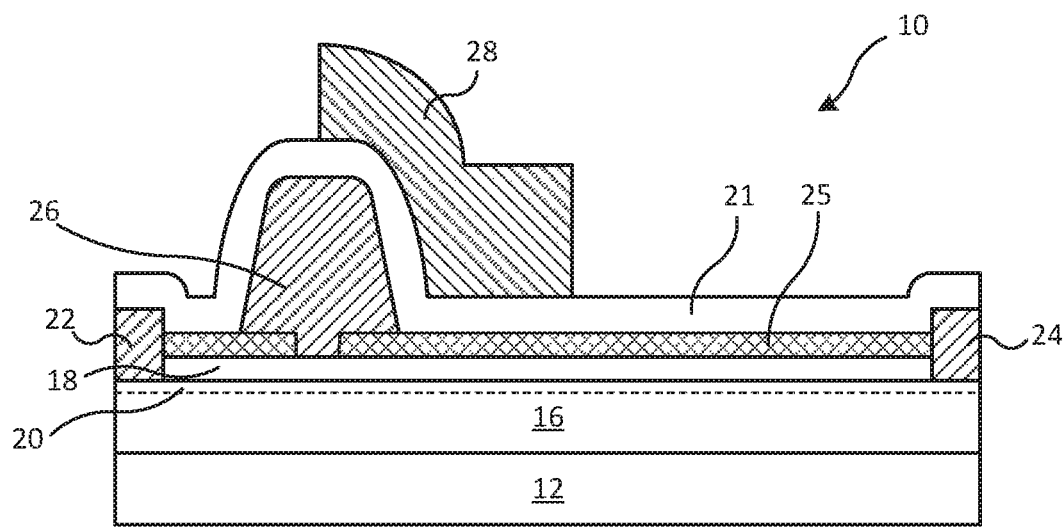
FIG. 1 is a cross-sectional view of a conventional transistor device including a field plate.

Embodiments of the inventive concepts will now be described in connection with the accompanying drawings. Some embodiments described herein provide a transistor device including a field plate that is self-aligned the gate, and in some embodiments that is laterally spaced apart from the gate, such that the field plate does not overlap the gate in the vertical direction. In some embodiments, the field plate is recessed toward the barrier layer in a recess region. In still further embodiments, the field plate may be connected to the source outside an active area of the device by means of a connection that does not cross over the gate of the device.

It is also understood that, although the ordinal terms first, second, third, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Furthermore, relative terms, such as "lower" or "bottom" and "upper" or "top," may be used herein to describe the relationship of one element to another as illustrated in the drawings. It is understood that relative terms are intended to encompass different orientations of the device in addition to the orientation depicted in the drawings. For example, if the device in one of the drawings is turned over, features described as being on the "lower" side of an element would then be oriented on "upper" side of that element. The exemplary term "lower" can therefore describe both lower and upper orientations, depending of the particular orientation of the device. Similarly, if the device in one of the drawings is turned over, elements described as "below" or "beneath" other elements would then be oriented above those other elements. The exemplary terms "below" or "beneath" can therefore describe both an orientation of above and below.

The terminology used in the description of the disclosure herein is for the purpose of describing particular embodiments only and is not intended to be limiting of the disclosure. As used in the description of the disclosure and the appended claims, the singular forms "an" and "the" are intended to include the plural forms as well, unless the context clearly indicates otherwise. It is also understood that the term "and/or" as used herein refers to and encompasses any and all possible combinations of one or more of the associated listed items. It will be further understood that the terms "comprises" and "comprising," when used in this specification, specify the presence of stated steps, operations, features, elements, and/or components, but do not preclude the presence or addition of one or more other steps, operations, features, elements, components, and/or groups thereof.

Embodiments of the disclosure are described herein with reference to cross-section illustrations that are schematic illustrations of idealized embodiments of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. The regions illustrated in the drawings are schematic in nature, and their shapes are not intended to illustrate the actual shape of a region of a device and are not intended to limit the scope of the disclosure unless explicitly stated otherwise. Further, lines that appear straight, horizontal, or vertical in the below drawings for schematic reasons will often be sloped, curved, non-horizontal, or non-vertical. Further, while the thicknesses of elements are meant to be schematic in nature.

Unless otherwise defined, all terms used in disclosing embodiments of the disclosure, including technical and scientific terms, have the same meaning as commonly understood by one of ordinary skill in the pertinent art and are not necessarily limited to the specific definitions known at the time of the present disclosure. Accordingly, these terms can include equivalent terms that are created after such time. It is further understood that terms, such as those defined in commonly used dictionaries, should be interpreted as having a meaning that is consistent with their meaning in the present specification and in the context of the relevant art.

Figure 2:
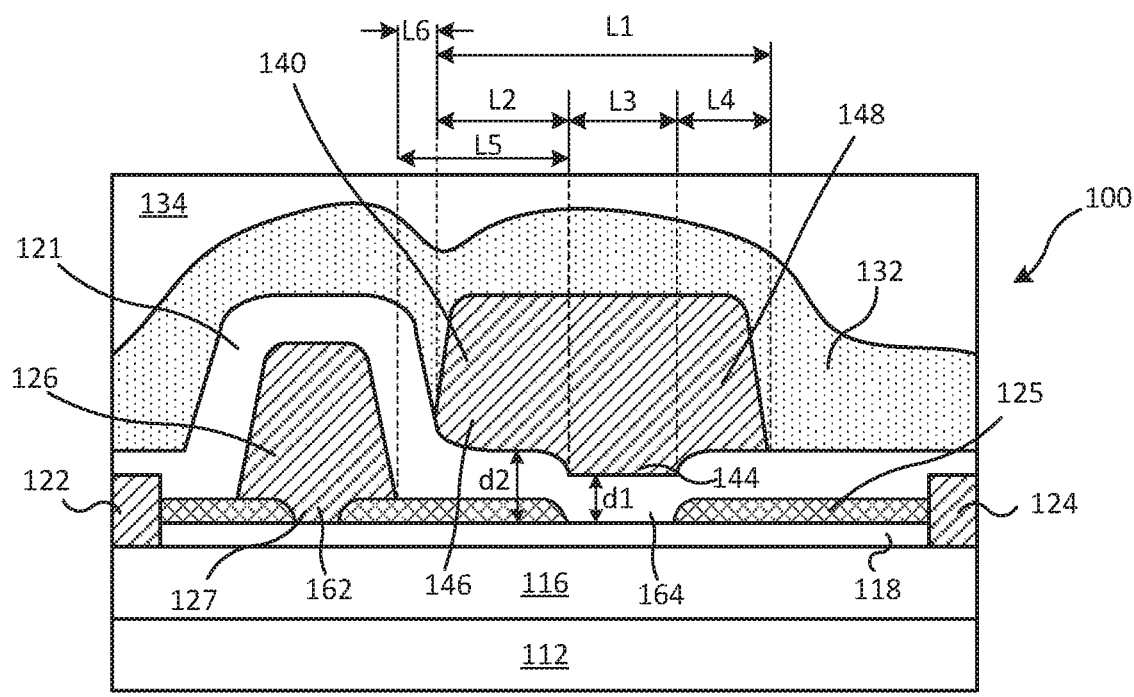
FIG. 2 is a cross-sectional view of a transistor device including a field plate in accordance with some embodiments.

Referring to FIG. 2, a transistor device according to some embodiments is illustrated. In particular, FIG. 2 illustrates a high electron mobility transistor 100 formed on a substrate 112. A channel layer 116 is formed on the substrate 112, and a barrier layer 118 is on the channel layer 116.

A source contact 122 and a drain contact 124 are formed on the channel layer 116. A gate 126 is formed on the barrier layer 118 between the source contact 122 and drain contact 124. As shown in FIG. 2, the gate 26 may have a mushroom or T-top configuration in which the gate 126 contacts the barrier layer 118 in a relative narrow contact region of a recessed contact portion 127 of the gate 126 that extends through a surface dielectric layer 125 within a gate aperture 162 that extends through the surface dielectric layer 125.

The surface dielectric layer 125 also includes a field plate aperture 164 that extends through the surface dielectric layer 125 to expose the barrier layer 118.

In some embodiments, the substrate 112 includes silicon carbide, the channel layer 116 includes GaN, and the barrier layer includes AlGaN. However, it will be appreciated that other materials or combinations of materials can be used. Moreover, the channel layer 116 and/or the barrier layer 118 may include an alloy such as $Al_xGa_{1-x}N$, where $0 \leq x \leq 1$. It will be further appreciated that although a HEMT device is illustrated, the device 100 may be another type of transistor device, such as a metal-semiconductor field effect transistor (MESFET), a junction field effect transistor (JFET), a metal oxide semiconductor field effect transistor (MOSFET), etc.

Figure 6:
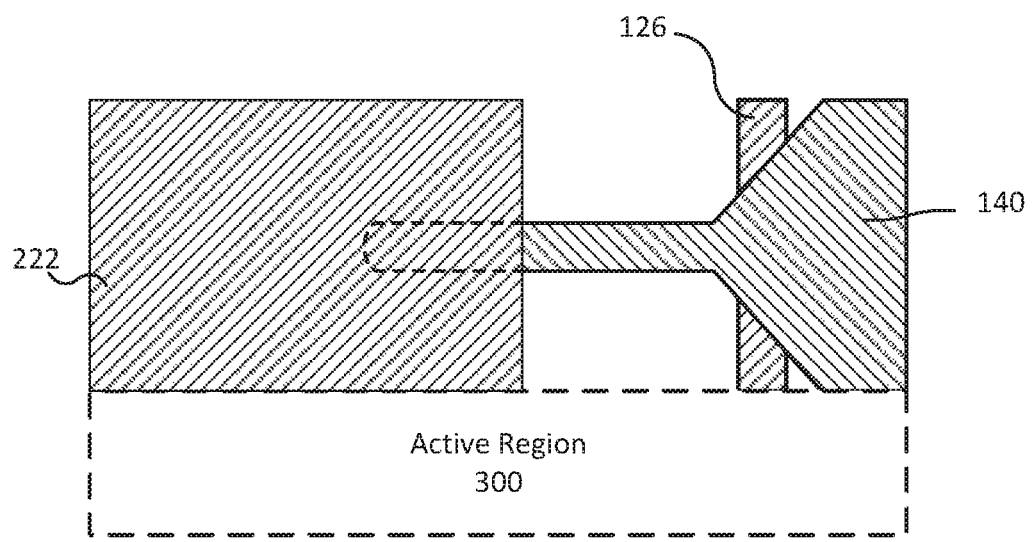
FIG. 6 is a plan view of a portion of a conventional transistor structure outside the active area of the device.

The device 100 includes a field plate 140 that is connected to the source contact 122 via a connection outside the active region of the device as described below in connection with FIGS. 6 and 7. As described below, in some embodiments, the connection between the field plate 140 and the source contact 122 does not cross over the gate 126.

The field plate 140 is spaced apart laterally from the gate 126 by an interlayer dielectric layer 121, and does not extend up and over the gate 126 as in the structure shown in FIG. 1, which may suffer from poor step coverage, leading to cracks in the field plate metallization. The field plate 140 is electrically connected to the source contact 122 outside the active region of the device (and outside the plane illustrated in FIG. 2).

Like the gate 126, the field plate 140 may have a mushroom or T-top configuration that is partially recessed with a central recessed portion 144 and one or more wing portions extending laterally from the recessed portion 144. In the embodiment shown in FIG. 2, the field plate 140 includes a source-side wing 146 extending laterally toward the source contact 122 and a drain-side wing 148 extending laterally toward the drain contact 124.

The field plate 140 is generally vertically spaced apart from the barrier layer 118 by the interlayer dielectric layer 121 and the surface dielectric layer 125. A distance d2 between the wings of the field plate 140 and the barrier layer 118 corresponds to a total thickness of the interlayer dielectric layer 121 and the surface dielectric layer 125. The field plate 140 includes a recessed portion 144 above the field plate aperture 164 that is vertically spaced apart from the barrier layer 118, within a region above the field plate aperture 164, by a distance d1 that is equal to only the thickness of the interlayer dielectric layer 121.

The field plate 140 has a total lateral width L1. The source-side wing 146 of the field plate 140 has a width L2, the recessed portion 144 of the field plate 140 has a width L3, and the drain-side wing 148 of the field plate 140 has a width L4. The recessed portion 144 of the field plate 140 is laterally spaced apart from the gate 126 by a distance L5, and the field plate 140 is laterally spaced apart from the gate 126 by a distance L6. As will be discussed below, adjusting the distances d1, d2 and widths L1 to L6 provides a number of degrees of freedom for modulating the gate-to-source and gate-to-drain capacitances of the device.

A passivation layer 132 is formed over the interlayer dielectric layer 121 and the field plate 140, and a field dielectric layer 134 is formed over the passivation layer 132. The passivation layer 132 may fill a gap between the field plate 140 and the gate 126 that is not filled by the interlayer dielectric layer 121.

The surface dielectric layer 125, the interlayer dielectric layer 121, the passivation layer 132 and the field dielectric layer 134 may include one or more layers of silicon nitride, silicon oxide, silicon oxynitride, aluminum oxide or other atomic layer deposition films, or a multilayer insulator structure, such as an oxide-nitride-oxide layer. In particular embodiments, the surface dielectric layer 125 and the interlayer dielectric layer 121 comprise silicon nitride, the passivation layer 132 comprises silicon oxynitride, and the field dielectric layer 134 comprises silicon nitride.

Figure 3A:
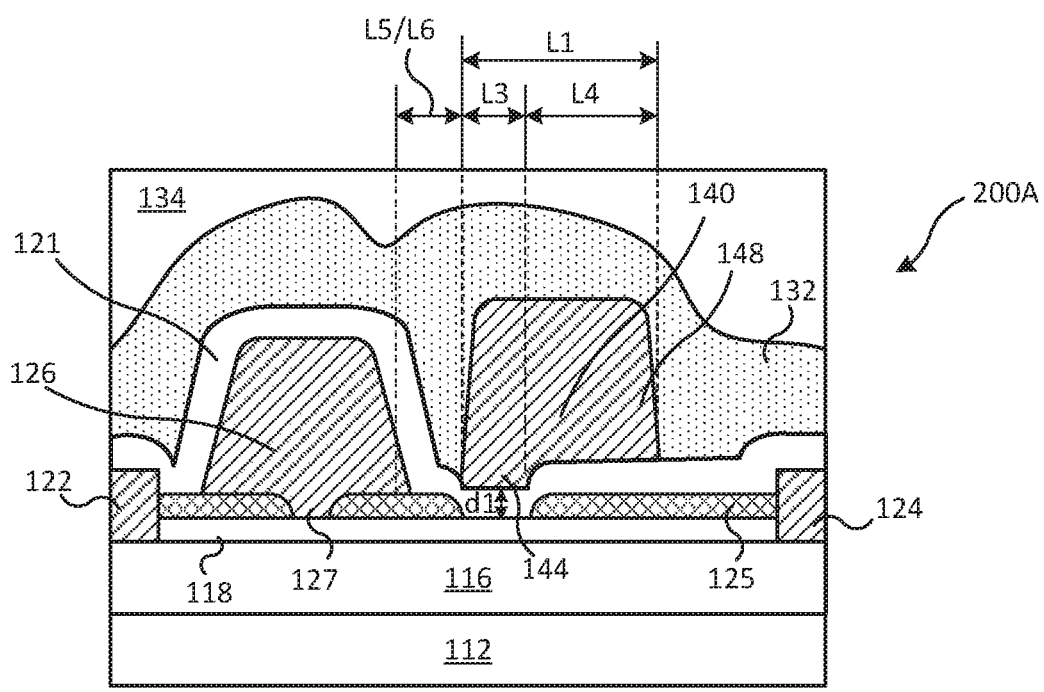
FIGS. 3A and 3B are cross-sectional views of transistor devices including field plates in accordance with further embodiments.

FIG. 3A illustrates a HEMT transistor device structure 200A according to further embodiments. The device 200 is similar to the device 100 shown in FIG. 2, with like numbers referring to like elements, except that the device 200 does not include a source-side wing 146. Thus, the distance L5 between the recessed portion 144 of the field plate 140 and the gate 126 defines the distance L6 between the field plate 140 and the gate 126, and the width L2 of the source-side wing 146 is zero.

Providing the recessed portion 144 of the field plate 140 changes the drain-to-source capacitance Cds and gate-to-drain capacitance Cgd of the device. In particular, providing the recessed portion 144 of the field plate 140 may reduce the gate-to-drain capacitance Cgd of the device for certain levels of drain voltage, at the possible expense of increasing the drain-to-source capacitance Cds at low drain voltages.

Figure 3B:
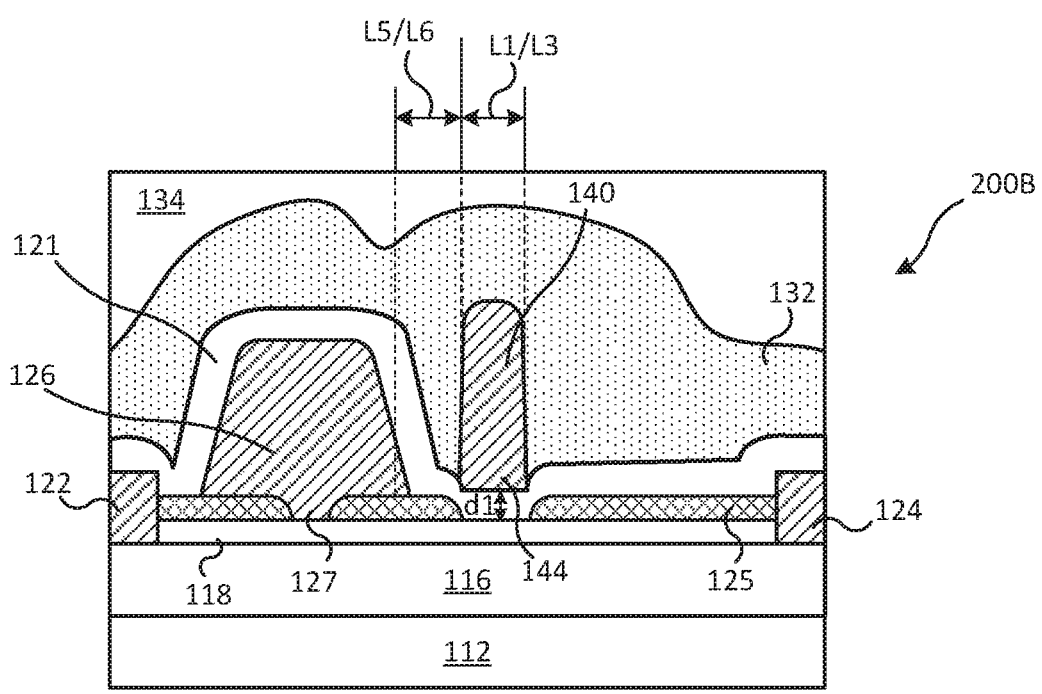

FIG. 3B illustrates a HEMT transistor device structure 200B according to further embodiments. The device 200 is similar to the device 100 shown in FIG. 2, with like numbers referring to like elements, except that the device 200 does not include a source-side wing 146 or a drain-side wing 148. Thus, the width L4 of the drain-side wing 148 is zero.

Figure 4A:
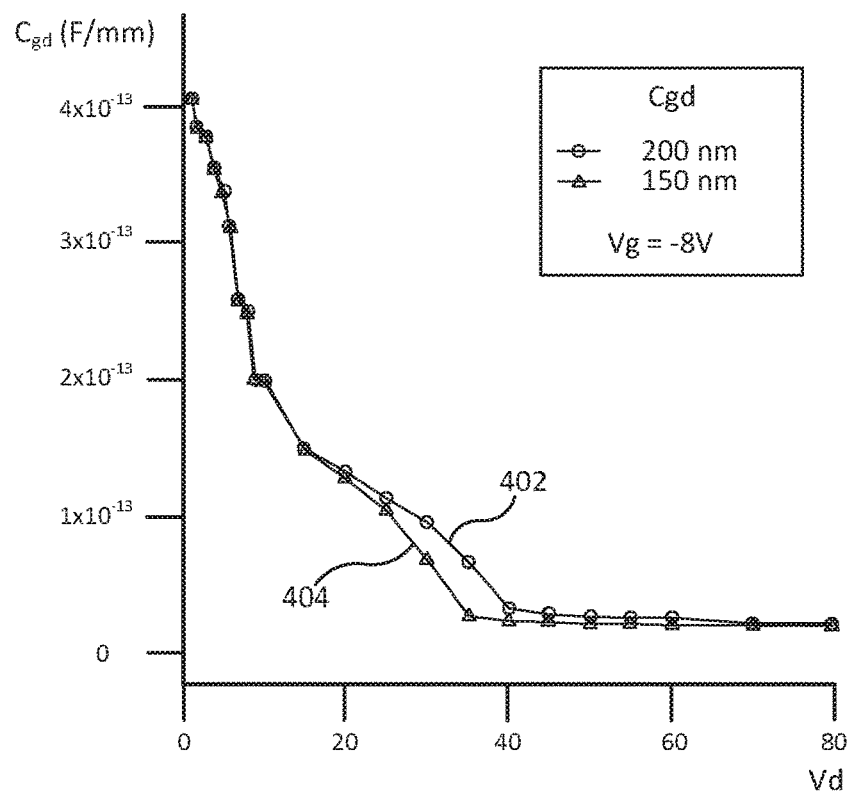
FIG. 4A is a graph of simulated gate-to-drain capacitance Cgd for a device according to some embodiments.
Figure 4B:
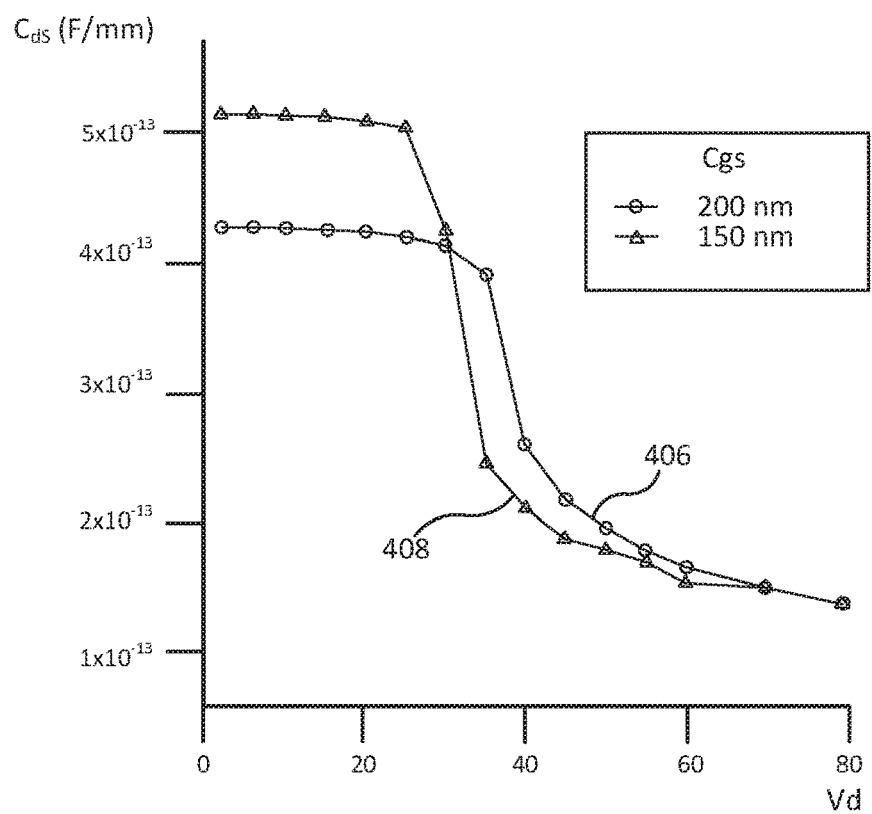
FIG. 4B is a graph of simulated drain-to-source capacitance Cds for a device according to some embodiments.

For example, FIG. 4A is a graph of simulated gate to drain capacitance Cgd for a device having a partially recessed field plate according to some embodiments, while FIG. 4B is a graph of simulated drain-to-source capacitance Cds for a device having a partially recessed field plate according to some embodiments. Referring to FIG. 4A, simulated curves of gate-to-drain capacitance Cgd are plotted for devices having a distance d1 between the recessed portion 144 of the field plate 140 and the barrier layer 118 of 200 nm (curve 402) and 150 nm (curve 404). The distance d1 between the recessed portion 144 of the field plate 140 and the barrier layer 118 is defined by the thickness of the interlayer dielectric layer 121.

In some embodiments, the distance d1 between the recessed portion 144 of the field plate 140 and the barrier layer 118 may be from about 60 nm to about 300 nm, and in some embodiments between about 100 nm and 200 nm. Recessing a portion of the field plate 140 as described herein may decrease the gate-to-drain capacitance, Cgd, which may increase the efficiency, linearity, gain, and/or bandwidth of an amplifier that is made using the device. Moreover, by using an etching process to form a field plate aperture 164 in the surface dielectric layer 125 that defines the location of the recessed portion 144 of the field plate 140, precise control over the positioning of the recessed portion 144 can be obtained, which may improve process repeatability and manufacturability of the device while also obtaining more precise control over the electrical properties of the device.

Separating the field plate 140 from the gate 126 in a lateral direction (e.g., by not overlapping the field plate 140 and the gate 126) may also reduce the gate-to-drain capacitance Cgd and/or drain-to-source capacitance Cds of the device by improving the ability of the field plate 140 to block feedback capacitance from the gate to the drain. That is, overlapping the field plate 140 and the gate 126 may result in additional parasitic capacitance without any added benefit.

As shown in FIG. 4A, for drain voltages above 30V, and particularly around 30-40V, the simulated device having a distance d1 of 150 nm exhibits lower gate-to-drain capacitance Cgd compared to the simulated device having a distance d1 of 200 nm.

Referring to FIG. 4B, the simulated device having a distance d1 of 150 nm exhibits undesirably higher drain-to-source capacitance Cds compared to the simulated device having a distance d1 of 200 nm for drain voltages less than about 30V. However, because the typical operating point for GaN-based HEMTs is a drain voltage of about 50V, this increased drain-to-source capacitance Cds may not affect normal device operation.

Accordingly, it is believed that spacing the field plate 140 apart laterally from the gate 126 may improve drain-to-source capacitance Cds while impairing the effect of the field plate 140 on gate-to-drain capacitance Cgd. Accordingly, a distance of the gap L6 between the field plate 140 and the gate 126 (as shown in FIGS. 2 and 3) may be selected to reduce gate-to-drain capacitance Cgd while not negatively affecting drain-to-source capacitance Cds. For example, in some embodiments, the gap L6 between the field plate 140 and the gate 126 may be from 0.2 microns to 0.7 microns. A gap of less than 0.2 microns may result in reliability problems, while a gap of greater than 0.7 microns may result in undesirably high gate-to-drain capacitance Cgd. In some embodiments, the gap L6 may be about 0.2 microns to about 0.4 microns.

The overall width of the field plate 140 (L1 in FIGS. 2 and 3) may be from about 0.6 to about 1.5 microns.

The width of the recessed portion 144 of the field plate 140 (L3 in FIGS. 2 and 3) may be about 0.5 to 0.9 microns.

In some embodiments, the gate aperture 162 and the field plate aperture 164 may be formed so that they have beveled or rounded edges. Beveling or rounding the edges of the gate aperture 162 and the field plate aperture 164 results in corresponding shapes to the recessed contact portion 127 of the gate 126 and the recessed portion 144 of the field plate 140, which helps to reduce field crowding around the gate 126 and the field plate 140.

The widths L2, L4 of the source-side wing 146 and the drain-side wing 148 of the field plate 140 may also affect the gate-to-drain capacitance Cgd and/or drain-to-source capacitance Cds of the device. The lengths of the wings 146, 148 may involve a trade-off between gate-to-drain capacitance Cgd and drain-to-source capacitance Cds. For example, the drain-side wing 148 may reduce gate-to-drain capacitance Cgd but increase drain-to-source capacitance Cds. The drain-side wing 148 may have a length L4 (FIGS. 2 and 3) of between about zero and 0.5 microns. In particular, the drain-side wing 148 may have a length L4 of about 0.3 microns. The source-side wing 146 may have a length L2 (FIGS. 2 and 3) of between about zero and 0.3 microns. In particular, the source-side wing 146 may have a length L2 of zero microns.

Additionally, because of the reduction of parasitic capacitance, the field plate 140 may not have to handle as high a level of current, and thus may be formed to have a smaller thickness than would otherwise be required.

FIGS. 5A to 5H are cross-sectional views illustrating operations for manufacturing a transistor device including a field plate in accordance with some embodiments.

Figure 5A:
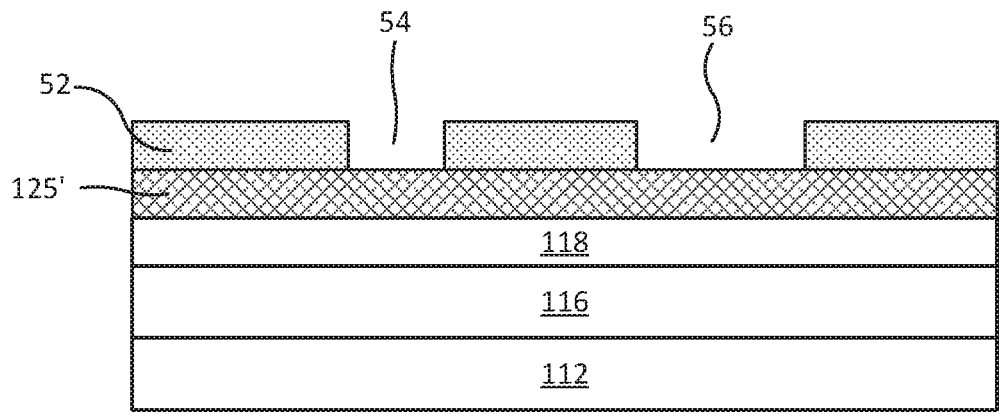
FIGS. 5A to 5H are cross-sectional views illustrating operations for manufacturing a transistor device including a field plate in accordance with some embodiments.

Referring to FIG. 5A, a substrate 112 is provided on which a channel layer 116 and a barrier layer 118 are formed. A preliminary surface dielectric layer 125' is formed on the barrier layer 118. A layer of photoresist 52 is formed on the preliminary surface dielectric layer 125' and patterned to form two openings 54, 56 therein.

Figure 5B:
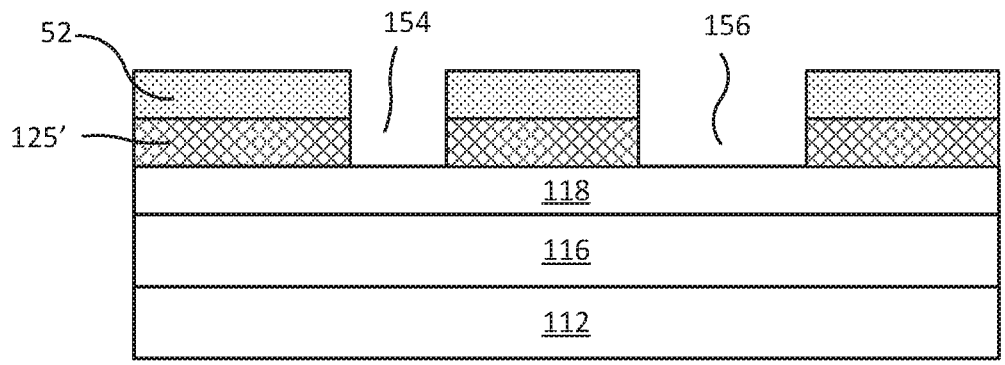

Referring to FIG. 5B, the preliminary surface dielectric layer 125' is selectively etched through the two openings 54, 56, for example using a reactive ion etch or inductively coupled plasma, to form two corresponding openings 154, 156 therein.

Figure 5C:
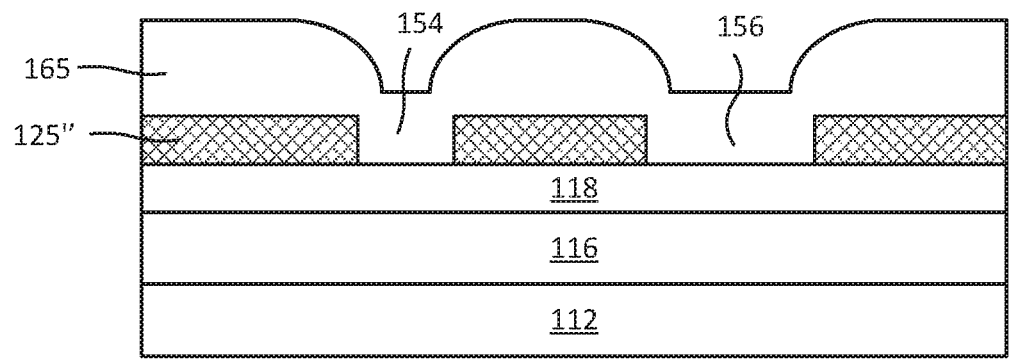

Referring to FIG. 5C, a sacrificial dielectric layer 165 is blanket deposited over the preliminary surface dielectric layer 125' to fill the openings 154, 156. The sacrificial dielectric layer 165 may be formed of the same material as the preliminary surface dielectric layer 125'. For example, both the sacrificial dielectric layer 165 and the preliminary surface dielectric layer 125' may be formed of silicon nitride.

Figure 5D:
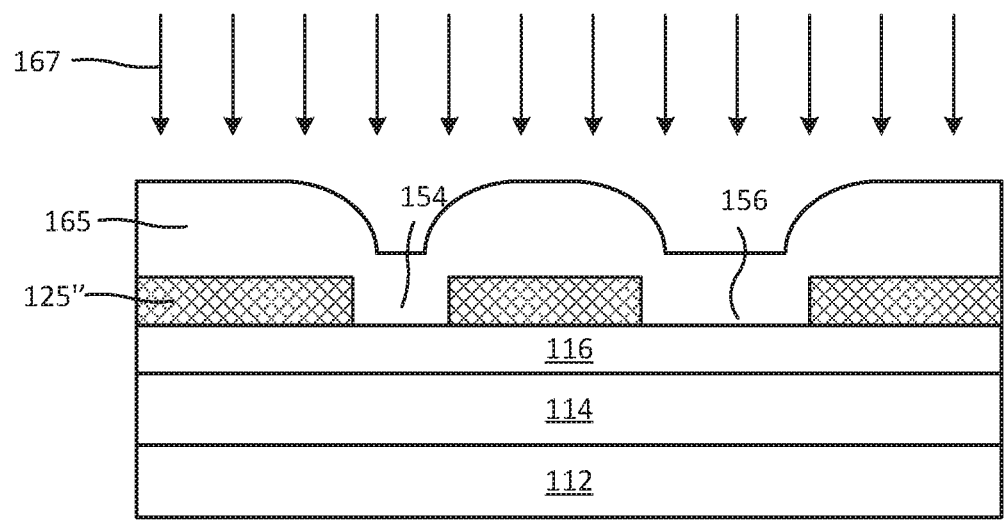
Figure 5E:
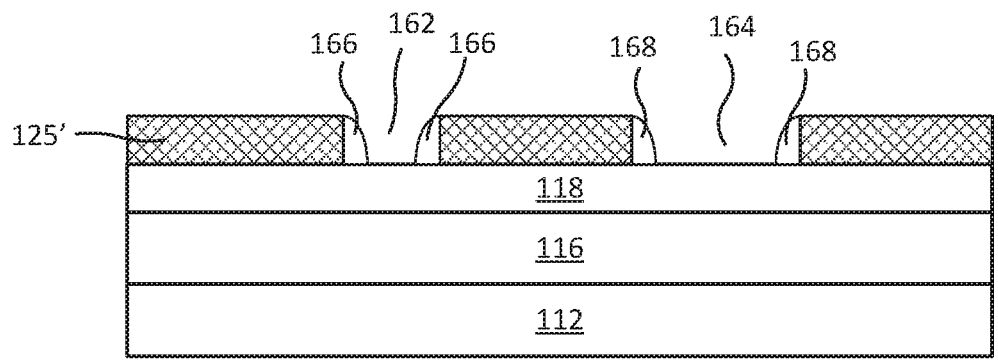

Referring to FIG. 5D, the sacrificial dielectric layer 165 is anisotropically etched, for example using a reactive ion etch or inductively coupled plasma 167, to remove portions of the sacrificial dielectric layer 165 except for side portions 166 on the inner surfaces of the opening 154 of the preliminary surface dielectric layer 125' and side portions 168 on the inner surfaces of the opening 156 of the preliminary surface dielectric layer 125' to form a gate aperture 162 and a field plate aperture 164 having rounded or beveled edges, as shown in FIG. 5E. The preliminary surface dielectric layer 125' along with the side portions 166, 168 together form a surface dielectric layer 125 on the barrier layer 118. With the side portions 166 present, the width of the gate aperture 162 may be about 250 nm.

Figure 5F:
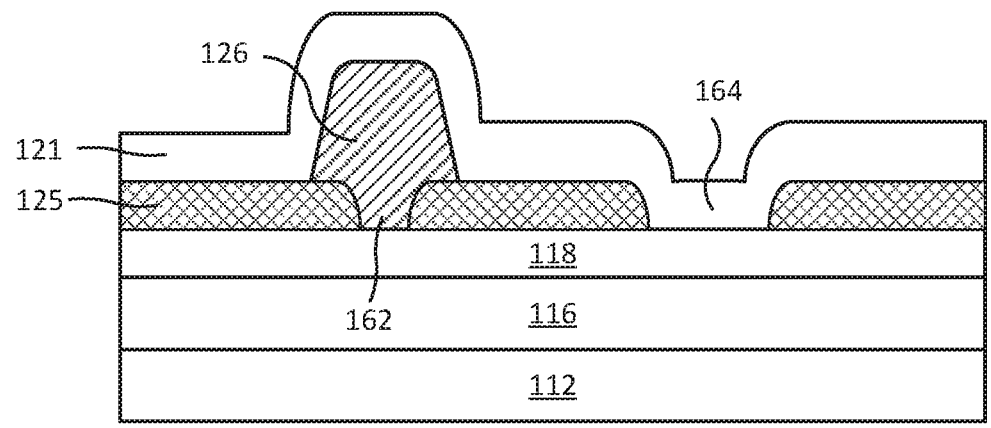

Referring to FIG. 5F, a metal, such as gold, is deposited and patterned to form a mushroom or T-top gate 126 on the surface dielectric layer 125. A recessed contact portion of the gate 126 extends through the gate aperture 162 to contact the barrier layer 118. An interlayer dielectric layer 121 is then blanket deposited over the surface dielectric layer 125 and the gate 126. The interlayer dielectric layer 121 extends through the field plate aperture 164 to contact the barrier layer 118.

Figure 5G:
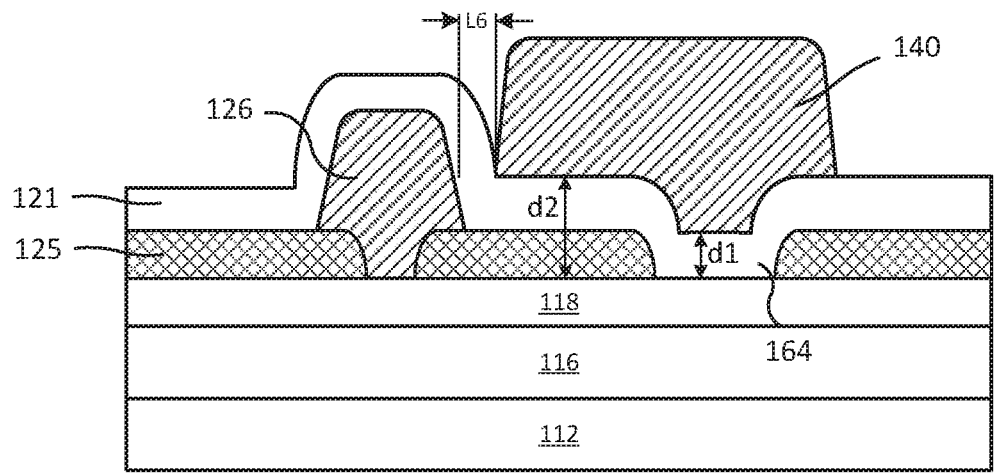

Referring to FIG. 5G, a metal, such as gold, is then deposited on the interlayer dielectric layer 121 above the field plate aperture 164 and patterned to form a field plate 140. The field plate 140 is separated from the barrier layer 118 within the field plate aperture 164 by a distance d1 corresponding to the thickness of the interlayer dielectric layer 121 and outside the field plate aperture 164 by a distance d2 corresponding to a sum of thicknesses of the interlayer dielectric layer 121 and the surface dielectric layer 125. The field plate 140 is laterally spaced apart from the gate 126 by a distance L6 that is approximately equal to the thickness of the interlayer dielectric layer 121. Accordingly, the field plate 140 is self-aligned to the gate 126 by the distance L6.

Figure 5H:
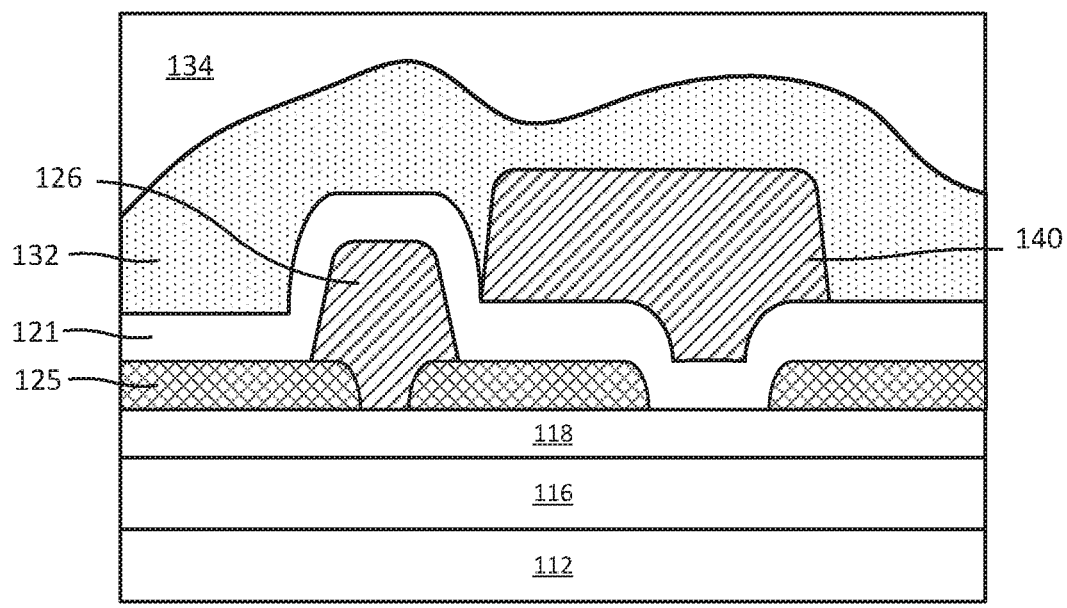

Referring to FIG. 5H, a passivation layer 132, such as a layer of SiON, is formed over the field plate 140 and the interlayer dielectric layer 121. Finally, a field dielectric layer 134, such as silicon nitride, is formed over the passivation layer 132.

As noted above, to further reduce the gate-to-drain capacitance Cgd and/or the drain-to-source capacitance Cds, the field plate 140 may be connected to the source contact 122 outside the active area of the device such that the connection does not cross over the gate metal. For example, FIG. 6 is a plan view of a portion of a conventional transistor structure outside the active region 300 of the device, where the "active region of the device" generally refers to the area of the device where an electrical channel between the source and drain regions is formed and where electrical conduction occurs through the channel layer 116 during ON-state operation of the device. As shown in FIG. 6, in a conventional device structure, the field plate 140 metallization crosses over the gate 126 metallization to contact a source overmetallization 222. This arrangement may increase the gate-to-drain capacitance Cgd and/or the drain-to-source capacitance Cds of the device.

Figure 7:
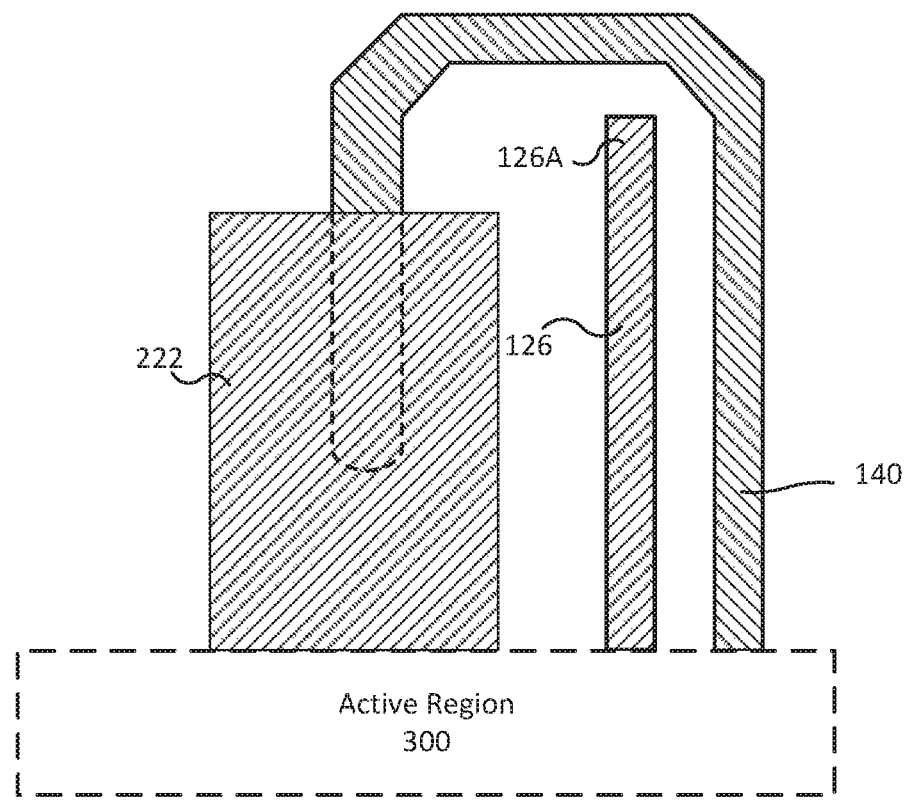
FIG. 7 is a plan view of a portion of a transistor structure according to some embodiments outside the active area of the device.

FIG. 7 is a plan view of a portion of a transistor structure according to some embodiments outside the active region 300 of the device. As shown in FIG. 7, in some embodiments, the field plate 140 metallization extends around the distal end 126A of the gate 126 metallization (rather than crossing over the gate 126 metallization) to contact the source overmetallization 222. This arrangement may reduce the gate-to-drain capacitance Cgd and/or the drain-to-source capacitance Cds of the device.

Figure 8:
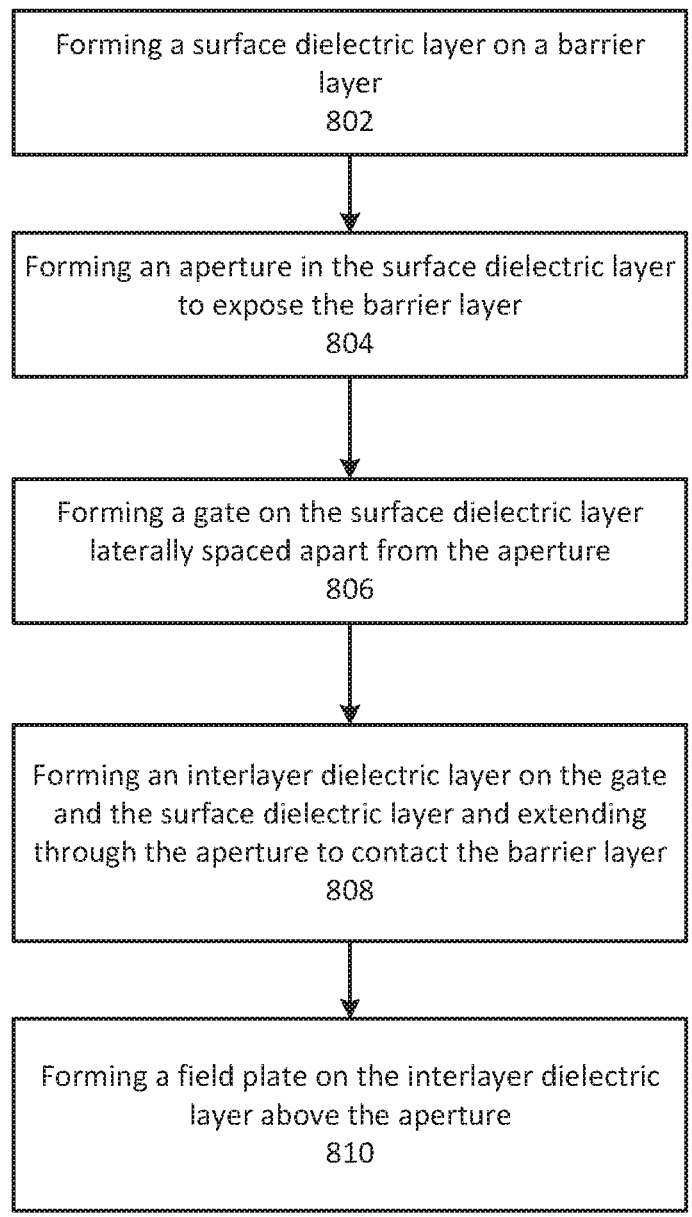
FIG. 8 is a block diagram illustrating operations of forming a transistor device according to some embodiments.

FIG. 8 is a block diagram illustrating operations of forming a transistor device according to some embodiments. Referring to FIG. 8 and FIGS. 5A to 5H, a method of forming a transistor device according to some embodiments includes forming a surface dielectric layer 125 on a semiconductor layer (block 802), forming an aperture 164 in the surface dielectric layer (block 804), forming a gate 126 on the surface dielectric layer 125, wherein the gate is laterally spaced apart from the aperture 164 (block 806), forming an interlayer dielectric layer 121 on the gate and the surface dielectric layer 125, the surface dielectric layer extending into the aperture 164 (block 808), and forming a field plate 140 on the interlayer dielectric layer 121 above the aperture 164 (block 810).

The method may further include forming a second aperture in the surface dielectric layer, wherein the first and second apertures are spaced apart laterally from each other. The gate is formed over the second aperture, and the gate includes a recessed contact portion extending through the second aperture. The recessed contact portion of the gate may contact the semiconductor layer.

The method may further include forming source and drain contacts on the semiconductor layer, wherein the gate is between the source and drain contacts. The field plate may include a recessed portion above the aperture and a drain-side wing extending over the semiconductor layer toward the drain contact. In some embodiments, the field plate includes a source-side wing extending over the semiconductor layer toward the source contact.

The recessed portion of the field plate may be vertically spaced apart from the semiconductor layer by a thickness of the interlayer dielectric layer. In some embodiments, the recessed portion of the field plate may be vertically spaced apart from the semiconductor layer by a distance of about 60 nm to about 300 nm, in some embodiments by a distance of about 100 nm to about 200 nm, and in some embodiments by a distance of about 150 nm.

The drain-side wing may be vertically spaced apart from the semiconductor layer by a combined thickness of the interlayer dielectric layer and the surface dielectric layer. In some embodiments, the drain-side wing has a width of about zero to about 500 nm.

The field plate may be laterally spaced apart from the gate by a thickness of the interlayer dielectric layer. In some embodiments, the field plate is laterally spaced apart from the gate by a thickness of about 200 nm to about 700 nm, and in some embodiments by a thickness of about 200 nm to about 400 nm.

In some embodiments, the field plate has an overall width of about 600 nm to 1500 nm. In some embodiments, the recessed portion of the field plate has a width of about 500 nm to about 900 nm.

In some embodiments, the aperture and/or the second aperture has beveled or rounded edges.

Forming the first and second apertures may include forming a preliminary surface dielectric layer on the semiconductor layer, selectively etching the preliminary surface dielectric layer to form first and second openings in the preliminary surface dielectric layer and depositing a sacrificial dielectric layer on the semiconductor layer and the preliminary surface dielectric layer, the sacrificial dielectric layer filling the first and second openings. The sacrificial dielectric layer may be anisotropically etched to expose portions of the semiconductor layer in the first and second openings, leaving side portions of the sacrificial dielectric layer on inner sidewalls of the openings.

The method may further include electrically connecting the field plate to the source contact outside an active region of the transistor device, wherein an electrical connection between the field plate and the source contact extends around an end of the gate and does not cross over the gate.

Transistor devices as described herein may be used in amplifiers that operate in a wide variety of different frequency bands. In some embodiments, the RF transistor amplifiers incorporating transistor devices as described herein may be configured to operate at frequencies greater than 1 GHz. In other embodiments, the RF transistor amplifiers may be configured to operate at frequencies greater than 2.5 GHz. In still other embodiments, the RF transistor amplifiers may be configured to operate at frequencies greater than 3.1 GHz. In yet additional embodiments, the RF transistor amplifiers may be configured to operate at frequencies greater than 5 GHz. In some embodiments, the RF transistor amplifiers may be configured to operate in at least one of the 2.5-2.7 GHz, 3.4-4.2 GHz, 5.1-5.8 GHz, 12-18 GHz, 18-27 GHz, 27-40 GHz or 40-75 GHz frequency bands or sub-portions thereof.

Although embodiments of the inventive concepts have been discussed above with respect to HEMT devices, it will be understood that the inventive concepts described herein may be applied to other types of semiconductor devices, such as MOSFETs, DMOS transistors, and/or laterally diffused MOS (LDMOS) transistors.

RF transistor amplifiers incorporating transistor devices described herein can be used in standalone RF transistor amplifiers and/or in multiple RF transistor amplifiers.

Examples of how the RF transistor amplifiers according to some embodiments may be used in applications that include multiple amplifiers will be discussed with reference to FIGS. 9A-9C.

Figure 9A:
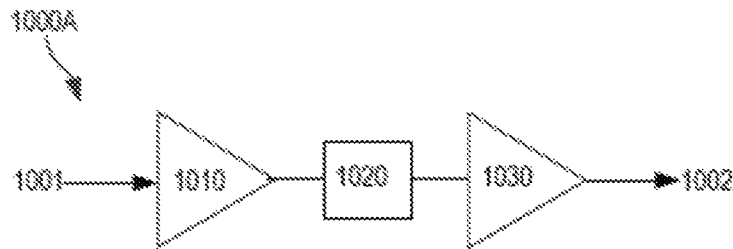
FIGS. 9A-9C are schematic block diagrams of multi-amplifier circuits in which RF transistor amplifiers incorporating transistor devices according to embodiments may be used.

Referring to FIG. 9A, an RF transistor amplifier 1000A is schematically illustrated that includes a pre-amplifier 1010 and a main amplifier 1030 that are electrically connected in series. As shown in FIG. 9A, RF transistor amplifier 1000A includes an RF input 1001, the pre-amplifier 1010, an inter-stage impedance matching network 1020, the main amplifier 1030, and an RF output 1002. The inter-stage impedance matching network 1020 may include, for example, inductors and/or capacitors arranged in any appropriate configuration in order to form a circuit that improves the impedance match between the output of pre-amplifier 1010 and the input of main amplifier 1030. While not shown in FIG. 9A, RF transistor amplifier 1000A may further include an input matching network that is interposed between RF input 1001 and pre-amplifier 1010, and/or an output matching network that is interposed between the main amplifier 1030 and the RF output 1002. The RF transistor amplifiers according to embodiments may be used to implement either or both of the pre-amplifier 1010 and the main amplifier 1030.

Figure 9B:
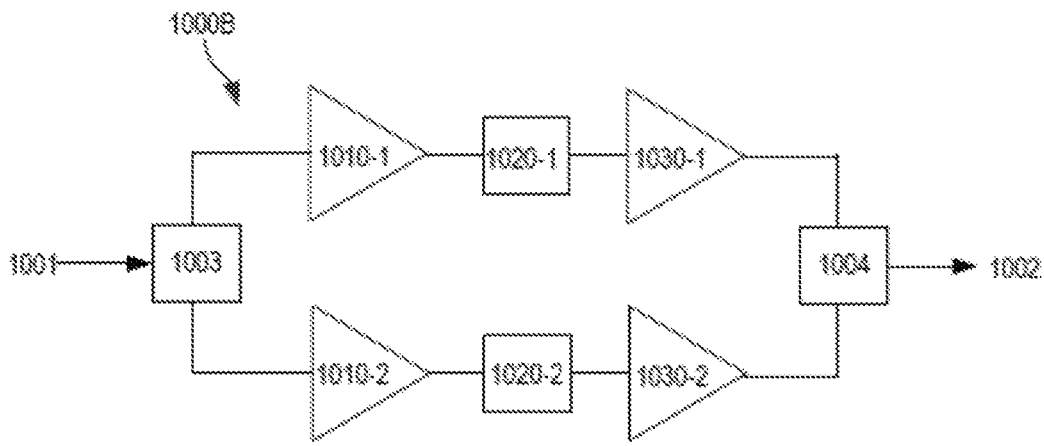

Referring to FIG. 9B, an RF transistor amplifier 1000B is schematically illustrated that includes an RF input 1001, a pair of pre-amplifiers 1010-1, 1010-2, a pair of inter-stage impedance matching networks 1020-1, 1020-2, a pair of main amplifiers 1030-1, 1030-2, and an RF output 1002. A splitter 1003 and a combiner 1004 are also provided. Pre-amplifier 1010-1 and main amplifier 1030-1 (which are electrically connected in series) are arranged electrically in parallel with pre-amplifier 1010-2 and main amplifier 1030-2 (which are electrically connected in series). As with the RF transistor amplifier 1000A of FIG. 9A, RF transistor amplifier 1000B may further include an input matching network that is interposed between RF input 1001 and pre-amplifiers 1010-1, 1010-2, and/or an output matching network that is interposed between the main amplifiers 1030-1, 1030-2 and the RF output 1002.

Figure 9C:
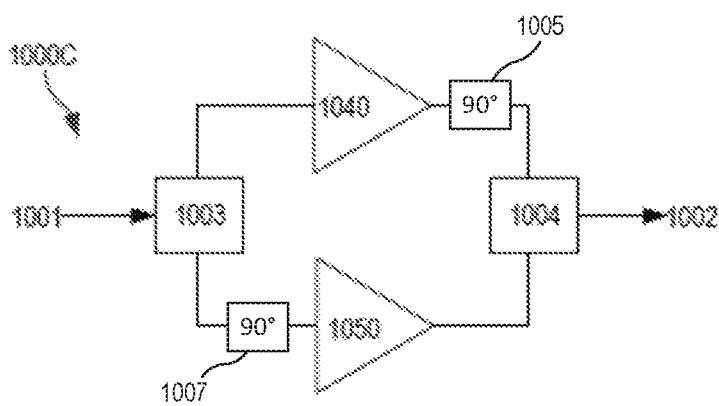

As shown in FIG. 9C, the RF transistor amplifiers according to some embodiments may also be used to implement Doherty amplifiers. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 9C, the Doherty RF transistor amplifier 1000C includes an RF input 1001, an input splitter 1003, a main amplifier 1040, a peaking amplifier 1050, an output combiner 1004 and an RF output 1002. The Doherty RF transistor amplifier 1000C includes a 90° transformer 1007 at the input of the peaking amplifier 1050 and a 90° transformer 1005 at the input of the main amplifier 1040, and may optionally include input matching networks and/or an output matching networks (not shown). The main amplifier 1040 and/or the peaking amplifier 1050 may be implemented using any of the above-described RF transistor amplifiers according to embodiments.

The RF transistor amplifiers according to embodiments may be formed as discrete devices, or may be formed as part of a Monolithic Microwave Integrated Circuit (MMIC). A MMIC refers to an integrated circuit that operates on radio and/or microwave frequency signals in which all of the circuitry for a particular function is integrated into a single semiconductor chip. An example MMIC device is a transistor amplifier that includes associated matching circuits, feed networks and the like that are all implemented on a common substrate. MMIC transistor amplifiers typically include a plurality of unit cell HEMT transistors that are connected in parallel.

Many variations of the features of the above embodiments are possible. Transistor structures with features that may be used in embodiments of the present invention are disclosed in the following commonly assigned publications, the contents of each of which are fully incorporated by reference herein in their entirety: U.S. Pat. No. 6,849,882 to Chavarkar et al. and entitled "Group-III Nitride Based High Electron Mobility Transistor (HEMT) With Barrier/Spacer Layer"; U.S. Pat. No. 7,230,284 to Parikh et al. and entitled "Insulating Gate AlGaN/GaN HEMT"; U.S. Pat. No. 7,501,669 to Parikh et al. and entitled "Wide Bandgap Transistor Devices With Field Plates"; U.S. Pat. No. 7,126,426 to Mishra et al. and entitled "Cascode Amplifier Structures Including Wide Bandgap Field Effect Transistor With Field Plates"; U.S. Pat. No. 7,550,783 to Wu et al. and entitled "Wide Bandgap HEMTs With Source Connected Field Plates"; U.S. Pat. No. 7,573,078 to Wu et al. and entitled "Wide Bandgap Transistors With Multiple Field Plates"; U.S. Pat. Pub. No. 2005/0253167 to Wu et al. and entitled "Wide Bandgap Field Effect Transistors With Source Connected Field Plates"; U.S. Pat. Pub. No. 2006/0202272 to Wu et al. and entitled "Wide Bandgap Transistors With Gate-Source Field Plates"; U.S. Pat. Pub. No. 2008/0128752 to Wu and entitled "GaN Based HEMTs With Buried Field Plates"; U.S. Pat. Pub. No. 2010/0276698 to Moore et al. and entitled "Gate Electrodes For Millimeter-Wave Operation and Methods of Fabrication; U.S. Pat. Pub. No. 2012/0049973 to Smith, Jr. et al. and entitled "High Power Gallium Nitride Field Effect Transistor Switches"; U.S. Pat. Pub. No. 2012/0194276 to Fisher and entitled "Low Noise Amplifiers Including Group III Nitride Based High Electron Mobility Transistors"; and U.S. Pat. No. 9,847,411 to Sriram et al. entitled "Recessed field plate transistor structures."

Although embodiments of the inventive concepts have been described in considerable detail with reference to certain configurations thereof, other versions are possible. The field plates and gates can also have many different shapes and can be connected to the source contact in many different ways. Accordingly, the spirit and scope of the invention should not be limited to the specific embodiments described above.

What is claimed is:

1. A transistor device, comprising:
   a semiconductor layer;
   a surface dielectric layer on the semiconductor layer;
   at least a portion of a gate on the surface dielectric layer, wherein the surface dielectric layer comprises an aperture therein that is laterally spaced apart from the gate;
   an interlayer dielectric layer on the surface dielectric layer, wherein the interlayer dielectric layer extends over the gate and into the aperture in the surface dielectric layer; and
   a field plate on the interlayer dielectric layer, wherein the field plate is laterally spaced apart from the gate by the interlayer dielectric layer such that the field plate does not overlap the gate in a vertical direction, wherein at least a portion of the field plate is above the aperture in the surface dielectric layer.

2. The transistor device of claim 1, wherein the field plate comprises a non-recessed portion extending over the semiconductor layer, wherein a recessed portion of the field plate is vertically spaced from the semiconductor layer by a smaller distance than the non-recessed portion is vertically spaced from the semiconductor layer.

3. The transistor device of claim 2, further comprising source and drain contacts on the semiconductor layer, wherein the gate is between the source and drain contacts, wherein the non-recessed portion comprises a drain-side wing extending away from the recessed portion over the semiconductor layer toward the drain contact.

4. The transistor device of claim 3, wherein the field plate includes a source-side wing extending over the semiconductor layer toward the source contact.

5. The transistor device of claim 3, wherein the drain-side wing has a width of about zero to about 500 nm.

6. The transistor device of claim 3, wherein the drain-side wing is vertically spaced apart from the semiconductor layer by a combined thickness of the interlayer dielectric layer and the surface dielectric layer.

7. The transistor device of claim 3, wherein the aperture comprises a first aperture, the transistor device further comprising:
   a second aperture in the surface dielectric layer that is laterally spaced apart from the first aperture;
   wherein a recessed contact portion of the gate extends through the second aperture.

8. The transistor device of claim 7, wherein the second aperture has beveled or rounded edges.

9. The transistor device of claim 3, wherein the aperture has beveled or rounded edges.

10. The transistor device of claim 1, wherein the aperture in the surface dielectric layer extends completely through the surface dielectric layer to expose the semiconductor layer.

11. The transistor device of claim 1, wherein the gate extends through the surface dielectric layer to contact the semiconductor layer.

12. The transistor device of claim 1, wherein a recessed portion of the field plate is vertically spaced apart from the semiconductor layer by a thickness of the interlayer dielectric layer.

13. The transistor device of claim 12, wherein the recessed portion of the field plate is vertically spaced apart from the semiconductor layer by a distance of about 60 nm to about 300 nm.

14. The transistor device of claim 13, wherein the recessed portion of the field plate is vertically spaced apart from the semiconductor layer by a distance of about 100 nm to about 200 nm.

15. The transistor device of claim 14, wherein the recessed portion of the field plate is vertically spaced apart from the semiconductor layer by a distance of about 150 nm.

16. The transistor device of claim 1, wherein the interlayer dielectric layer has a vertical thickness, and wherein the field plate is laterally spaced apart from the gate by a distance that is about equal to the vertical thickness of the interlayer dielectric layer.

17. The transistor device of claim 1, wherein the field plate is laterally spaced apart from the gate by a thickness of about 200 nm to about 700 nm.

18. The transistor device of claim 1, wherein the field plate is laterally spaced apart from the gate by a thickness of about 200 nm to about 400 nm.

19. The transistor device of claim 1, wherein the field plate has an overall width of about 600 nm to 1500 nm.

20. The transistor device of claim 1, wherein a recessed portion of the field plate has a width of about 500 nm to about 900 nm.

21. A transistor device, comprising:
a semiconductor layer;
a surface dielectric layer on the semiconductor layer;
at least a portion of a gate on the surface dielectric layer, wherein the surface dielectric layer comprises an aperture therein that is laterally spaced apart from the gate;
an interlayer dielectric layer on the surface dielectric layer;
a field plate on the interlayer dielectric layer, wherein the field plate is laterally spaced apart from the gate, wherein at least a portion of the field plate is above the aperture in the surface dielectric layer; and
source and drain contacts on the semiconductor layer, wherein the gate is between the source and drain contacts;
wherein the field plate is electrically connected to the source contact outside an active region of the transistor device, wherein an electrical connection between the field plate and the source contact does not cross over the gate.

22. A method of forming a transistor device, comprising:
forming a surface dielectric layer on a semiconductor layer;
forming an aperture in the surface dielectric layer;
forming a gate on the surface dielectric layer, wherein the gate is laterally spaced apart from the aperture;
forming an interlayer dielectric layer on the gate and the surface dielectric layer, the interlayer dielectric layer extending into the aperture and extending over the gate; and
forming a field plate on the interlayer dielectric layer above the aperture, wherein the field plate is spaced apart from the gate by the interlayer dielectric layer such that the field plate does not overlap the gate in a vertical direction.

23. The method of claim 22, wherein the aperture comprises a first aperture, the method further comprising:
forming a second aperture in the surface dielectric layer, wherein the first and second apertures are spaced apart laterally from each other;
wherein the gate is formed over the second aperture, and wherein the gate comprises a recessed contact portion extending through the second aperture.

24. The method of claim 23, wherein the recessed contact portion of the gate contacts the semiconductor layer.

25. The method of claim 23, wherein the second aperture has beveled or rounded edges.

26. The method of claim 23, wherein forming the first and second apertures comprises:
forming a preliminary surface dielectric layer on the semiconductor layer;
selectively etching the preliminary surface dielectric layer to form first and second openings in the preliminary surface dielectric layer;
depositing a sacrificial dielectric layer on the semiconductor layer and the preliminary surface dielectric layer, the sacrificial dielectric layer filling the first and second openings; and
anisotropically etching the sacrificial dielectric layer to expose portions of the semiconductor layer in the first and second openings and leaving side portions of the sacrificial dielectric layer on inner sidewalls of the first and second openings, wherein the preliminary surface dielectric layer and the side portions define the surface dielectric layer.

27. The method of claim 22, further comprising:
forming source and drain contacts on the semiconductor layer, wherein the gate is between the source and drain contacts;
wherein the field plate includes a recessed portion above the aperture and a drain-side wing extending over the semiconductor layer toward the drain contact.

28. The method of claim 27, wherein the field plate includes a source-side wing extending over the semiconductor layer toward the source contact.

29. The method of claim 27, wherein the drain-side wing is vertically spaced apart from the semiconductor layer by a combined thickness of the interlayer dielectric layer and the surface dielectric layer.

30. The method of claim 27, wherein the drain-side wing has a width of about zero to about 500 nm.

31. The method of claim 27, wherein the recessed portion of the field plate has a width of about 500 nm to about 900 nm.

32. The method of claim 27, wherein the recessed portion of the field plate is vertically spaced apart from the semiconductor layer by a thickness of the interlayer dielectric layer.

33. The method of claim 32, wherein the recessed portion of the field plate is vertically spaced apart from the semiconductor layer by a distance of about 60 nm to about 300 nm.

34. The method of claim 33, wherein the recessed portion of the field plate is vertically spaced apart from the semiconductor layer by a distance of about 100 nm to about 200 nm.

35. The method of claim 34, wherein the recessed portion of the field plate is vertically spaced apart from the semiconductor layer by a distance of about 150 nm.

36. The method of claim 22, wherein the field plate is laterally spaced apart from the gate by a thickness of the interlayer dielectric layer.

37. The method of claim 22, wherein the field plate is laterally spaced apart from the gate by a thickness of about 200 nm to about 700 nm.

38. The method of claim 22, wherein the field plate is laterally spaced apart from the gate by a thickness of about 200 nm to about 400 nm.

39. The method of claim 22, wherein the field plate has an overall width of about 600 nm to 1500 nm.

40. The method of claim 22, wherein the aperture has beveled or rounded edges.

41. A method of forming a transistor device, comprising:
forming a surface dielectric layer on a semiconductor layer;
forming an aperture in the surface dielectric layer;
forming a gate on the surface dielectric layer, wherein the gate is laterally spaced apart from the aperture;

forming an interlayer dielectric layer on the gate and the surface dielectric layer, the interlayer dielectric layer extending into the aperture;

forming a field plate on the interlayer dielectric layer above the aperture;

forming source and drain contacts on the semiconductor layer, wherein the gate is between the source and drain contacts; and electrically connecting the field plate to the source contact outside an active region of the transistor device, wherein an electrical connection between the field plate and the source contact does not cross over the gate.

42. A transistor device, comprising:

a semiconductor layer;

a surface dielectric layer on the semiconductor layer;

at least a portion of a gate on the surface dielectric layer, wherein the surface dielectric layer comprises an aperture therein that is laterally spaced apart from the gate;

an interlayer dielectric layer on the surface dielectric layer comprising an indentation above the aperture, wherein the interlayer dielectric layer extends over the gate and into the aperture in the surface dielectric layer; and at least a portion of a field plate is in the indentation in the interlayer dielectric layer, wherein the field plate is spaced apart from the gate by the interlayer dielectric layer such that the field plate does not overlap the gate in a vertical direction.

43. The transistor device of claim 42, wherein the field plate comprises a non-recessed portion extending over the semiconductor layer, wherein the portion of the field plate in the indentation is vertically spaced from the semiconductor layer by a smaller distance than the non-recessed portion is vertically spaced from the semiconductor layer.

44. The transistor device of claim 43, further comprising source and drain contacts on the semiconductor layer, wherein the gate is between the source and drain contacts, wherein the non-recessed portion comprises a drain-side wing extending over the semiconductor layer toward the drain contact.

45. The transistor device of claim 44, further comprising a source-side wing extending over the semiconductor layer toward the source contact.

* * * * *